(12) United States Patent
Wang

(10) Patent No.: US 11,276,843 B2
(45) Date of Patent: Mar. 15, 2022

(54) OLED DISPLAY PANEL AND PREPARATION METHOD THEREOF

(71) Applicant: Wuhan China Star Optoelectronics Semiconductor Display Technology Co., Ltd., Hubei (CN)

(72) Inventor: Lei Wang, Hubei (CN)

(73) Assignee: WUHAN CHINA STAR OPTOELECTRONICS SEMICONDUCTOR DISPLAY TECHNOLOGY CO., LTD., Wuhan Hubei (CN)

( * ) Notice: Subject to any disclaimer, the term of this patent is extended or adjusted under 35 U.S.C. 154(b) by 27 days.

(21) Appl. No.: 16/615,396

(22) PCT Filed: May 7, 2019

(86) PCT No.: PCT/CN2019/085820
§ 371 (c)(1),
(2) Date: Nov. 20, 2019

(87) PCT Pub. No.: WO2020/191861
PCT Pub. Date: Oct. 1, 2020

(65) Prior Publication Data
US 2020/0411800 A1    Dec. 31, 2020

(30) Foreign Application Priority Data
Mar. 27, 2019  (CN) .......................... 201910238224.9

(51) Int. Cl.
*H01L 51/52* (2006.01)
*H01L 27/32* (2006.01)
(52) U.S. Cl.
CPC ........ *H01L 51/5271* (2013.01); *H01L 27/322* (2013.01); *H01L 27/3246* (2013.01); *H01L 51/5284* (2013.01); *H01L 2227/323* (2013.01)

(58) Field of Classification Search
CPC ............. H01L 51/5271; H01L 51/5275; H01L 51/5284; H01L 27/3246; H01L 27/322
See application file for complete search history.

(56) References Cited

U.S. PATENT DOCUMENTS 6,549,335 B1 * 4/2003 Trapani ................ G02B 5/3033
345/32
6,827,456 B2 * 12/2004 Parker .................. G02B 6/0061
362/629

(Continued)

FOREIGN PATENT DOCUMENTS

CN        1674752 A     9/2005
CN      101726776 A     6/2010

(Continued)

*Primary Examiner* — Mohsen Ahmadi
(74) *Attorney, Agent, or Firm* — Hamre, Schumann, Mueller & Larson, P.C.

(57) ABSTRACT

An organic light emitting diode (OLED) display panel and a preparation method thereof, the OLED display panel includes an OLED device layer, a light emitting layer, an encapsulation layer and a color film layer which are disposed layer by layer. The light emitting layer includes a first light emitting area and a second light emitting area which are spaced apart, and a pixel defined layer (PDL) area is disposed between the first light emitting area and the second light emitting area. The color film layer includes a first color film area and a second color film area which are spaced apart, and a black matrix (BM) area is disposed between the first color film area and the second color film area. A reflection layer is disposed between the color film layer and the light emitting layer.

9 Claims, 6 Drawing Sheets

(56) References Cited

U.S. PATENT DOCUMENTS

| | | | |
|---|---|---|---|
| 8,835,962 B2* | 9/2014 | Shi | H01L 51/56 |
| | | | 257/98 |
| 8,993,994 B2* | 3/2015 | Song | H01L 27/1255 |
| | | | 257/13 |
| 9,935,294 B2* | 4/2018 | Yang | H01L 51/504 |
| 10,388,913 B2* | 8/2019 | Jung | H01L 27/3216 |
| 10,700,140 B2* | 6/2020 | Lim | H01L 51/5206 |
| 10,847,584 B2* | 11/2020 | Bae | H01L 51/56 |
| 10,971,702 B2* | 4/2021 | Kim | H01L 27/3248 |
| 2005/0212407 A1 | 9/2005 | Matsusue | |
| 2007/0001602 A1* | 1/2007 | Miyake | H01J 11/12 |
| | | | 313/582 |
| 2007/0103056 A1* | 5/2007 | Cok | H01L 27/322 |
| | | | 313/503 |
| 2008/0237611 A1* | 10/2008 | Cok | H01L 51/5281 |
| | | | 257/79 |
| 2008/0278063 A1* | 11/2008 | Cok | H01L 51/5271 |
| | | | 313/500 |
| 2010/0090595 A1 | 4/2010 | Nomura et al. | |
| 2016/0087245 A1 | 3/2016 | Park et al. | |
| 2016/0268554 A1* | 9/2016 | Wu | H01L 27/32 |
| 2017/0179437 A1 | 6/2017 | Kim et al. | |

FOREIGN PATENT DOCUMENTS

| | | |
|---|---|---|
| CN | 107026240 A | 8/2017 |
| JP | 2007157404 A | 6/2007 |

\* cited by examiner

OLED DISPLAY PANEL AND PREPARATION METHOD THEREOF

FIELD OF INVENTION

The present disclosure relates to a display technology field, and particularly to an organic light emitting diode (OLED) display panel and a preparation method thereof.

BACKGROUND OF INVENTION

As known, because an organic light emitting diode (OLED) display has many advantages, such as self-illumination, low driving voltage, high light emitting efficiency, short response time, high definition and contrast, nearly 180 visual angle, wide temperature applying range, can realize a flexible display and full color display with large area, etc., which is applied extensively in display field, illumination field, wearable smart devices, and fields so on.

Traditional OLED displays, generally dispose a polarizer to reduce reflectivity of the display panel under glare. However, although a polarizer (POL) can reduce the reflectivity under glare where the display panel is, it loses almost 58% of the light extraction. This for an OLED display panel, extremely increases lifespan burden. Further, a polarizer has characteristics of large thickness, brittleness, etc., thereby which makes then unfavorable for a development of dynamic bending products. For developing a dynamic bending product, which is based on an OLED display technology, it is necessary to import new material, new technology, and new processes to replace a polarizer.

For this, the industry has developed a new style polarizer free (POL-less) technical solution to respond, wherein one of which is applying a color filter layer to replace a polarizer, it can not only reduce a thickness of a capability layer from about 100 μm to less than 5 μm, but also can improve a light extraction rate from 42% to 60%. Therefore, the color film layer based on POL-less technology is considered as one of the key technologies to realize the development of the dynamic bending product by the industry.

Specifically, a structure of a color film layer generally includes red (R) color film areas, green (G) color film areas, blue (B) color film areas and black matrix (BM) areas which are disposed between each color film areas. Based on the characteristic of self-illumination of an OLED, the colors of each of the color film areas in the color film layers are necessary to correspond to red pixel units, green pixel units and blue pixel units of the OLED. However, for the whole color film layer which is formed after a spin coating or an ink printing, because of the property of the material itself, there is still a high reflection effect on the self-luminous of the OLED, and ambient light.

Therefore, it is necessary to develop a new style OLED display panel to overcome the defects of the prior art.

SUMMARY OF INVENTION

One aspect of the present disclosure is to provide an organic light emitting diode (OLED) display panel, which is through application of a new style structure of a display panel for the problem of the poor transmission rate of the current color film layer, and can improve the whole light extraction rate and the chromaticity of the display panel.

The technical solution of the present disclosure applied is as follows:

An organic light emitting diode (OLED) display panel includes an OLED device layer, a light emitting layer, an encapsulation layer and a color film layer which are disposed layer by layer. The light emitting layer includes a first light emitting area and a second light emitting area which are spaced apart, and a pixel define layer (PDL) area is disposed between the first light emitting area and the second light emitting area. The color film layer includes a first color film area and a second color film area which are spaced apart, wherein a black matrix (BM) area is disposed between the first color film area and the second color film area. A reflection layer is disposed between the color film layer and the light emitting layer, wherein the reflection layer defines a reflection surface, wherein at least part of light emitted from the first light emitting area passes through the reflection surface by a reflection and then emitted from the first color film area.

Further, wherein a surface of the reflection surface is disposed with a convexity or a concavity. In this way, making the surface of the reflection surface being not a smooth surface, for example, it can be a plane with bending curves or a plane with wave curves, thereby let the reflection surface can make the light which emitted from the light emitting area and injects onto it can pass through and be reflected many times on its waves surface first and emits from the color film area which it corresponds to.

Further, wherein the reflection surface which the reflection layer defines includes a first reflection surface and a second reflection surface, wherein at least part of the light emitted from the first light emitting area is reflected to the second reflection surface by the first reflection surface first, and then through a reflection of the second reflection surface emitted from the first color film area.

Further, wherein a surface of the first reflection surface is disposed with a convexity or a concavity.

Further, wherein a surface of the second reflection surface is disposed with a convexity or a concavity.

Further, wherein the reflection surface includes a first lateral section and a second lateral section which are disposed oppositely, wherein the first lateral section is constituted by connecting an upper section and a bottom section together, wherein at least part of a surface of the upper section of the first lateral section defines the first reflection surface, at least part of a surface of the bottom section of the first lateral section defines the second reflection surface. For example, the first lateral section can be a bending structure which includes an upper section and a bottom section, wherein the upper section and the bottom section are connected to each other with a certain angle.

Further, wherein the first reflection surface and the second reflection surface are connected to each other up and down, and an angle θ1 between the first reflection surface and the second reflection surface is within a range 10 degrees to 70 degrees.

Further, wherein an angle θ2 between the first reflection surface and a bottom surface of the color film layer is within a range 100 degrees to 170 degrees.

Further, wherein an angle θ3 between the second reflection surface and a surface of the encapsulation layer is within a range 100 degrees to 170 degrees.

Further, wherein the second lateral section is also constituted by connecting an upper section and a bottom section together, wherein at least part of a surface of the upper section of the second lateral section is defined as a third reflection surface, and at least part of a surface of the bottom section of the second lateral section is defined as a fourth reflection surface; wherein at least part of light emitted from the second light emitting area is reflected to the fourth reflection surface by the third reflection surface first, and then through a reflection of the fourth reflection surface emitted from the second color film area.

Further, wherein the third reflection surface and the fourth reflection surface are connected to each other up and down, and an angle θ4 between the third reflection surface and the fourth reflection surface is within a range 10 degrees to 70 degrees.

Further, wherein an angle θ5 between the third reflection surface and a bottom surface of the color film layer is within a range 100 degrees to 170 degrees.

Further, wherein an angle θ6 between the fourth reflection surface and a surface of the encapsulation layer is within a range 100 degrees to 170 degrees.

Further, wherein the third reflection surface and the first reflection surface are disposed symmetrically, and the fourth reflection surface and the second reflection surface are disposed symmetrically.

Further, wherein the area occupied by a upper surface of the reflection layer corresponds to the area where the BM area which is between the first color film area and the second color film area is, the area occupied by a bottom surface of the reflection layer corresponds to the area where the PDL area which is between the first light emitting area and the second light emitting area is.

Further, wherein material which the reflection layer applied is transparent metal oxide material, such as indium doped zinc oxide (IZO), indium tin oxide (ITO), and so on.

Further, wherein there are two or more of the reflection layer, and the reflection layers are spaced apart from each other, wherein a planarization layer is disposed between the two adjacent reflection layers to fill a gap between the two reflection layers.

Further, another aspect of the present disclosure is to provide a preparation method for preparing the organic light emitting diode (OLED) display panel which the present disclosure relates to and includes following steps:

Providing a thin film transistor (TFT) substrate, and on where disposing an OLED device layer, a light emitting layer and a encapsulation layer sequentially, wherein the light emitting layer includes a first light emitting area, a second light emitting area and a pixel define layer area which is disposed between the first light emitting area and the second light emitting area.

Forming the reflection layer on the encapsulation layer, wherein the reflection layer defines a reflection surface.

Forming the color film layer on the reflection layer, wherein the color film layer includes the first color film area, the second color film area and the black matrix area which is disposed between the first color film area and the second color film area.

Further, wherein forming the reflection layer on the encapsulation layer includes following steps:

Forming a bottom section of the reflection layer on the encapsulation layer first, and then forming a planarization layer on the encapsulation layer, forming an upper section of the reflection layer on the upper position of the bottom section of the reflection layer, wherein a lateral surface of the upper section of the reflection layer is defined as a first reflection surface, and a lateral surface of the bottom section of the reflection layer which is at the same side to the upper section of the reflection layer is defined as a second reflection surface.

The OLED display panel which the present disclosure relates to, which is disposed the reflection layer between the color film layer and the light emitting layer, makes the incident light which is emitted from the light emitting layer and originally shielded by a black matrix (BM) area of a color film layer of a current design after passes through the reflection layer by a refection can be emitted from the corresponding color film area. In this way, due to additionally adding this part of the light which has been reflected and then emitted, thereby obviously improves the light extraction rate of the light emitting area, and with the improvement of the light extraction rate of each light emitting area, it also improves the whole light extraction rate of the light emitting layer of the display panel.

Further, due to the improvement of the light extraction rate of the corresponding color of the light which emitted from the light emitting layer, correspondingly improves a convergence effect of the light, thereby improves a whole chromaticity of the display panel.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The technical solutions of an organic light emitting diode display (OLED) panel and a preparation method thereof according to the present disclosure will be further described in detail as follow with reference to the accompanying drawings and embodiments.

Figure 1:
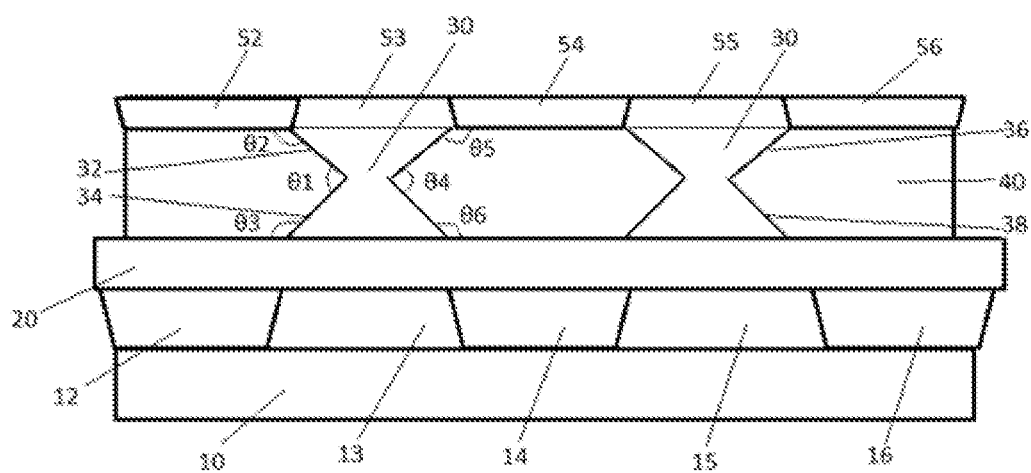
FIG. 1 is a structural schematic diagram of an OLED display panel of an embodiment provided by the present disclosure.

Please refer to FIG. 1, where an embodiment of the present disclosure provides an organic light emitting diode (OLED) display panel, which includes a thin film transistor (TFT) substrate (not be illustrated in the drawings), and on where layer by layer sequentially disposing an OLED device layer 10, a light emitting layer, a encapsulation layer 20, and a color film layer.

A plurality of reflection layers 30 are disposed between the encapsulation layer 20 and the color film layer, the reflection layers 30 are spaced apart to each other, wherein a planarization layer 40 is filled between the two adjacent reflection layers 30. Wherein material which the reflection layer applied includes transparent metal oxide material, such as indium doped zinc oxide (IZO), indium tin oxide (ITO)

and so on, but are not limited to. Also, the planarization layer 40 generally is constituted by transparent material, preferably.

Further, the light emitting layer includes a first light emitting area 12, a second light emitting area 14 and a third light emitting area 16 which are spaced apart to each other, and a pixel defined layer (PDL) area 13 and a PDL area 15 are disposed between the two adjacent light emitting areas. These light emitting areas correspond to different colors, generally are red, green and blue respectively. Correspondingly, the color film layer includes a first color film area 52, a second color film area 54 and a third color film area 56 which are spaced apart to each other, and a black matrix (BM) area 53 and a BM area 55 are disposed between the two adjacent color film areas. The colors of these color film areas correspond to the colors of the beneath light emitting areas, respectively.

The reflection layer 30, for example, can be a structure which is combined with two trapezoidal structures to each other up and down. The bottom section of the reflection layer 30 is a trapezoidal structure, and the upper section of the reflection layer 30 is an inverted trapezoidal structure, in this way, makes two lateral sections of the reflection layer 30 be a bending structure, the bending surface of the corresponding two opposite lateral sections of the trapezoidal structure and the inverted trapezoidal structure define a first reflection surface 32, a second reflection surface 34, a third reflection surface 36 and a fourth reflection surface 38. The first reflection surface 32 and the second reflection surface 34 are located on a same side of the reflection layer 30 and are connected to each other up and down and correspond to the first light emitting area 12; and the third reflection surface 36 and the fourth reflection surface are located on the other side of the reflection layer 30 and are connected to each other up and down and correspond to the second light emitting area 14.

Figure 2:
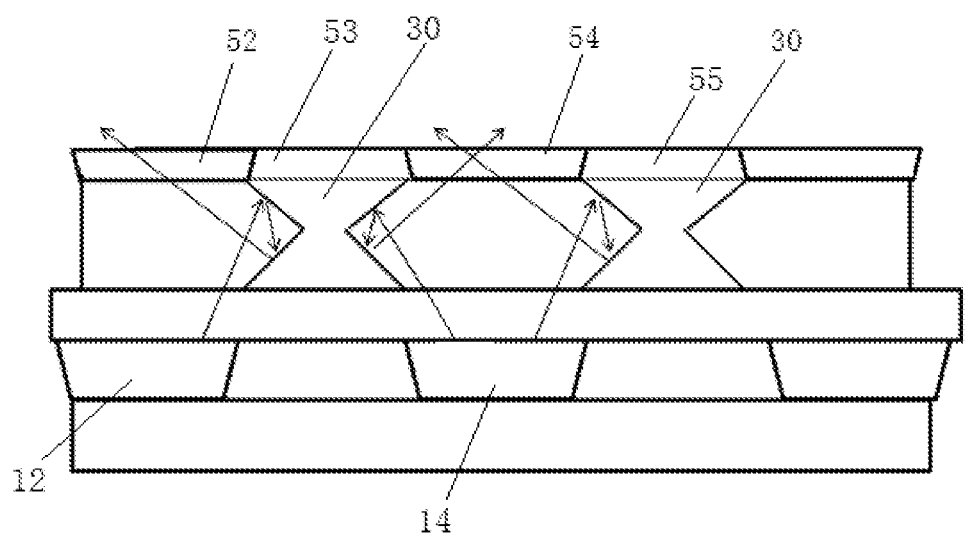
FIG. 2 is a reflection light path schematic diagram of the light emitted from each light emitting area of the OLED display panel illustrated in FIG. 1.

In this way, with the design of the upper reflection surface and the bottom reflection surface of the reflection layer 30, makes the light which is obliquely emitted by the first light emitting area 12 and originally should be shielded by the BM area of the color film layer of the current design passes through the first reflection surface 32 and the second reflection surface 34 by a reflection, and then can be emitted from the first color film area 52, thereby obviously increasing the light extraction rate of the first light emitting area 12. Similarly, it is also applicable in the second light emitting area 14 and the third light emitting area 16, the specific light path emitted by the reflected light please refer to FIG. 2.

The area occupied by the upper surface of the reflection layer 30 corresponds to the area where the BM area 53 which is between the first color film area 52 and the second color film area 54 is, the area occupied by the bottom surface of the reflection layer 30 corresponds to the area where the PDL area 13 which is between the first light emitting area 12 and the second light emitting area 14 is. In order to ensure a good light extraction rate, an edge of the bottom reflection layer 30 should be better to avoid a propagation edge of the light which is emitted from the light emitting area where is at side and beneath the reflection layer 30 and then passes through the encapsulation layer 20, and an angle of inclination θ2 of the first reflection surface 32, an angle of inclination θ3 of the second reflection surface 34 and an angle θ1 between the first reflection surface 32 and the second reflection surface 34 can make the oblique light emitted from the light emitting area can all be reflected back to the color film area which is between each of the BM area. The same theory is also applicable for an angle of inclination θ5 of the third reflection surface, an angle of inclination θ6 of the fourth reflection surface, and an angle θ4 between the third reflection surface and the fourth reflection surface.

However in different embodiments, the decision of the specific degrees of the above-mentioned angle θ1, θ2, θ3, θ4, θ5 and θ6 can be decided based on actual requirements, and there is no limited to, it is not necessary to limit these angles being a degree value which can reflects all the oblique light of the light emitting area, that only can reflect part of the light is also the scope of the inventive concept of the present invention.

Further, wherein the light emitting area emits the oblique light which is necessary to be reflected and then be emitted from the color film area, is not limited to through two reflections, it can only pass through the reflection surface by a reflection and then be emitted from the corresponding color film area, and can also pass between the reflection surfaces by many reflections and then emitted from the corresponding color film area.

If the light obliquely emitted from the light emitting area only requires one reflection and then can be emitted from the corresponding color film area, it only requires to adjust the angle of inclination of the second reflection surface and can make part of the oblique light emitted from the light emitting area only requires to pass through the second reflection surface by a reflection and can be emitted from the color film area, not necessary to pass through the first reflection surface 32 and to be reflected to the second reflection surface 34.

While the situation requires to reflect many times is that the first light emitting area 12 emits oblique light passes through the first reflection surface 32 first and then be reflected to the second reflection surface 34, and then be reflected back to the first reflection surface 32 by the second reflection surface 34, and then be reflected from the corresponding first color film area 52 by the second reflection surface 34, that is, after through the two turns of the to-and-fro reflections between the first reflection surface and the second reflection surface, it is emitted from the corresponding color film area.

While the present disclosure preferably disposes two reflection surfaces and makes the oblique light emitted from the light emitting area through the cooperative reflection of the two reflection surfaces and be emitted from the corresponding color film area, which can obtain a good light extraction rate, but not limited to dispose at least two reflection surfaces certainly. While in another embodiment, it can also be that the reflection layer only disposes one reflection surface.

Figure 3:
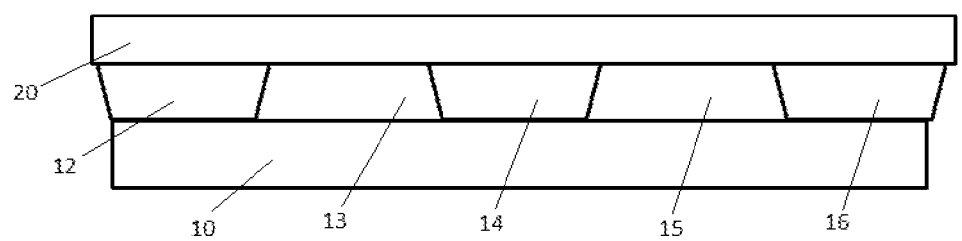
FIG. 3 is a structural schematic diagram after the first step of a preparation method of an OLED display panel provided by another embodiment of the present disclosure has been finished.

Further, another aspect of the present disclosure is to provide a preparation method for preparing the organic light emitting diode (OLED) display panel, which includes following steps:

Preparing an OLED device layer 10, a light emitting layer and a encapsulation layer and thin film encapsulation (TFE) layer 20 on a substrate which provides a thin film transistor (TFT), wherein the light emitting layer includes a first light emitting area 12, a second light emitting area 14, a third light emitting area 16 and a PDL area 13 and a PDL area 15 are disposed between the light emitting areas, the finished structural drawing please refer to FIG. 3.

Figure 4:
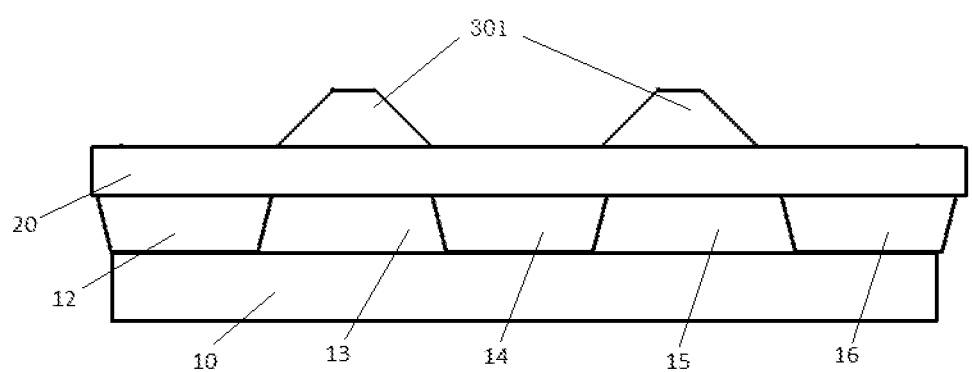
FIG. 4 is a structural schematic diagram after the second step of the preparation method of the OLED display panel illustrated in FIG. 3 has been finished.
Figure 5:
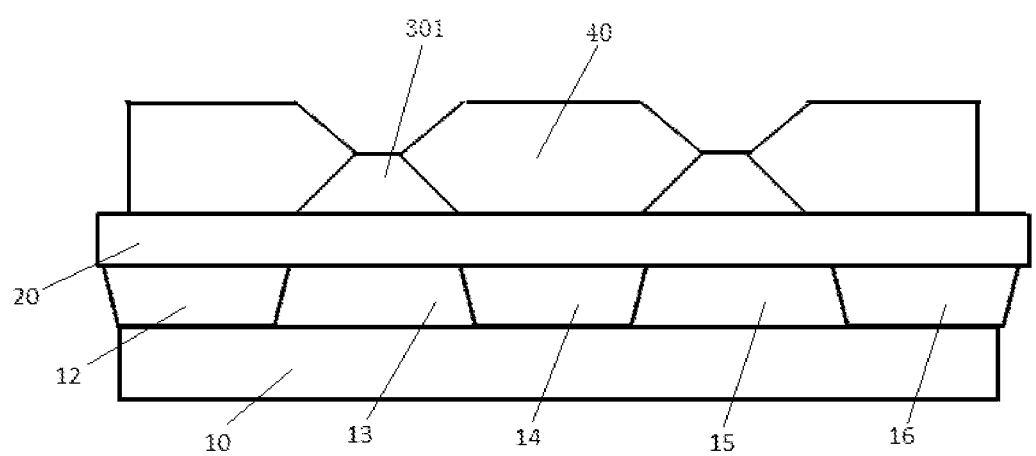
FIG. 5 is a structural schematic diagram after the third step of the preparation method of the OLED display panel illustrated in FIG. 3 has been finished.
Figure 6:
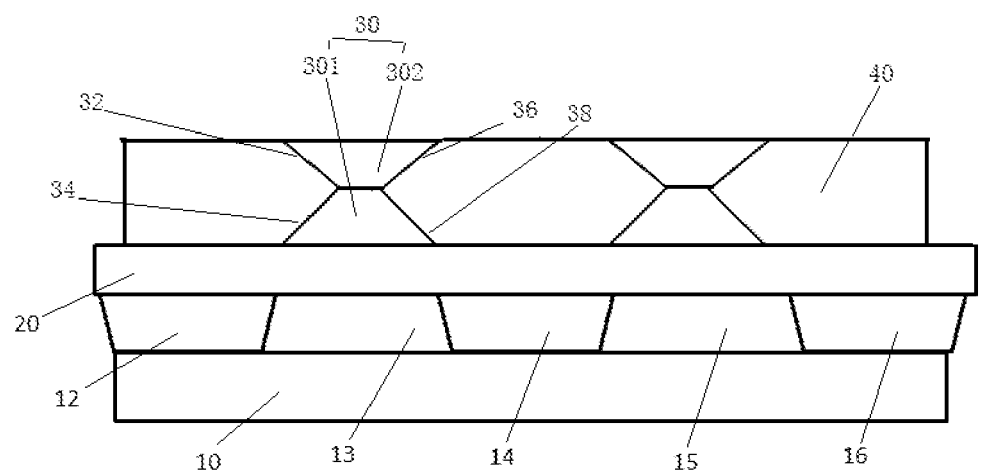
FIG. 6 is a structural schematic diagram after the fourth step of the preparation method of the OLED display panel illustrated in FIG. 3 has been finished.

Forming the reflection layer 30 on the encapsulation layer 20, which is through steps such as deposition, exposure, etch and so on to form a bottom section 301 of the reflection layer, the finished diagram, please refer to FIG. 4, and then performing the preparation of the planarization layer 40 which is constituted by transparent overcoat (OC) material, at the specific area of the planarization layer 40 where is at a upper location of the bottom section 301 of the reflection layer after be exposed to form a setting pattern, the finished structural diagram, please refer to FIG. 5. Finally, when performing the preparation of the upper section 302 of the reflection layer, which is further through steps such as deposition, exposure, etch and so on, wherein the finished structure of the diagram, please refer to FIG. 6. So far, have finished the whole structures of the reflection layer 30.

The bottom section 301 of the finished reflection layer which is an isosceles trapezoidal structure, preferably ensures edge of its bottom surface to avoid the light propagation edge which is at its outside and bottom where the light emitting area is encapsulated by the TFE layer. A surface of one waist of the bottom section 301 is defined as a second reflection surface, and an angle of inclination (taper angle) of the surface of its waist can make the incident light of it can enter in to the color film area of the subsequently formed corresponding color film layer. While the upper section 302 of the reflection layer, is also preferable an reversed isosceles trapezoidal structure, a surface of its waist is defined as a first reflection surface and also preferably ensures an angle of inclination (taper angle) of the surface of its waist can make the light which is emitted from the light emitting area and through the TFE layer can after pass through first reflection surface by a reflection and then can be reflected to the second reflection surface which is defined by the bottom section of the reflection layer.

Forming the color film layer on the reflection layer 30, wherein the color film layer includes a first color film area 52, a second color film area 54, a third color film area 56, and a BM area 53 and a BM area 55 which are disposed between the adjacent color film areas, thereby finally finishing the polarizer free (POL-less) structure which includes a color filter (CF), the specific finished structural diagram please refer to FIG. 1.

The organic light emitting diode (OLED) display panel which the present disclosure relates to, which is disposed the reflection layer between the color film layer and the light emitting layer, making the incident light which is emitted from the light emitting layer and originally shielded by the BM area of the color film layer of the current design, after passing through the reflection layer by a reflection can be emitted from the corresponding color film area, thereby, due to additionally adding this part of the light which has been reflected and then emitted, further obviously improving the light extraction rate of the light emitting area. With the improvement of the light extraction rate of each light emitting area, it also improves the whole light extraction rate of the light emitting layer of the display panel.

Further, due to the improvement of the light extraction rate of the corresponding color of the light which emitted from the light emitting layer, it correspondingly improves a convergence effect of the light, thereby improves a whole chromaticity of the display panel.

The technical scope of the present disclosure is not limited to the above description, and those skilled in the art can make various modifications and changes to the above embodiments without departing from the technical idea of the present disclosure, and this modifications and changes are all within the scope of the present disclosure.

What is claimed is:

1. An organic light emitting diode (OLED) display panel, comprising an OLED device layer, a light emitting layer, an encapsulation layer and a color film layer which are disposed layer by layer;
    wherein the light emitting layer comprises a first light emitting area and a second light emitting area which are spaced apart, and a pixel define layer area is disposed between the first light emitting area and the second light emitting area; the color film layer comprises a first color film area and a second color film area which are spaced apart, wherein a black matrix area is disposed between the first color film area and the second color film area;
    wherein a reflection layer is disposed between the color film layer and the light emitting layer, wherein the reflection layer defines a reflection surface;
    wherein the reflection surface defined by the reflection layer comprises a first reflection surface and a second reflection surface; and
    wherein at least part of the light emitted from the first light emitting area is reflected to the second reflection surface by the first reflection surface first, and then through a reflection of the second reflection surface emitted from the first color film area.

2. The OLED display panel as claimed in claim 1, wherein a surface of the reflection surface is disposed with a convexity or a concavity.

3. The OLED display panel as claimed in claim 1, wherein the reflection surface comprises a first lateral section and a second lateral section which are disposed oppositely, wherein the first lateral section is constituted by connecting an upper section and a bottom section together, wherein at least part of a surface of the upper section of the first lateral section defines the first reflection surface, at least part of a surface of the bottom section of the first lateral section defines the second reflection surface.

4. The OLED display panel as claimed in claim 3, wherein the second lateral section is also constituted by connecting an upper section and a bottom section together, wherein at least part of a surface of the upper section of the second lateral section is defined as a third reflection surface, and at least part of a surface of the bottom section of the second lateral section is defined as a fourth reflection surface;
    wherein at least part of light emitted from the second light emitting area is reflected to the fourth reflection surface by the third reflection surface first, and then through a reflection of the fourth reflection surface emitted from the second color film area.

5. The OLED display panel as claimed in claim 4, wherein the third reflection surface and the first reflection surface are disposed symmetrically, and the fourth reflection surface and the second reflection surface are disposed symmetrically.

6. The OLED display panel as claimed in claim 1, wherein material which the reflection layer applied is transparent metal oxide material.

7. The OLED display panel as claimed in claim 1, wherein a number of the reflection layer is two or more, and the reflection layers are spaced apart from each other, wherein a planarization layer is disposed between the two adjacent reflection layers to fill a gap between the two reflection layers.

8. A preparation method for preparing the organic light emitting diode (OLED) display panel, comprising following steps:
    providing a thin film transistor (TFT) substrate, and on where disposing an OLED device layer, a light emitting layer and an encapsulation layer sequentially, wherein the light emitting layer comprises a first light emitting area, a second light emitting area and a pixel define layer area which is disposed between the first light emitting area and the second light emitting area;

forming a reflection layer on the encapsulation layer, wherein the reflection layer defines a reflection surface; and forming a color film layer on the reflection layer, wherein the color film layer comprises a first color film area, a second color film area, and a black matrix area disposed between the first color film area and the second color film area, wherein the reflection layer is disposed between the color film layer and the light emitting layer, the reflection surface defined by the reflection layer comprises a first reflection surface and a second reflection surface, and wherein at least part of the light emitted from the first light emitting area is reflected to the second reflection surface by the first reflection surface first, and then through a reflection of the second reflection surface emitted from the first color film area.

9. The preparation method for preparing the OLED display panel as claimed in claim 8, wherein forming the reflection layer on the encapsulation layer comprises following steps:

forming a bottom section of the reflection layer on the encapsulation layer first, and then forming a planarization layer on the encapsulation layer, forming an upper section of the reflection layer on the position of the bottom section of the reflection layer, wherein a lateral surface of the upper section of the reflection layer is defined as a first reflection surface, and a lateral surface of the bottom section of the reflection layer which is on a same side to the upper section of the reflection layer is defined as a second reflection surface.

* * * * *